United States Patent
Huang et al.

(10) Patent No.: US 9,793,212 B2
(45) Date of Patent: Oct. 17, 2017

(54) INTERCONNECT STRUCTURES AND METHODS OF FORMING SAME

(71) Applicant: Taiwan Semiconductor Manufacturing Company, Ltd., Hsin-Chu (TW)

(72) Inventors: Yi-Chun Huang, Pingjhen (TW); Chih-Hsiang Yao, Taipei (TW); Jye-Yen Cheng, Taichung (TW); Wen-Chuan Chiang, Hsin-Chu (TW); Ying-Wen Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 52 days.

(21) Appl. No.: 14/688,895

(22) Filed: Apr. 16, 2015

(65) Prior Publication Data

US 2016/0307793 A1    Oct. 20, 2016

(51) Int. Cl.
*H01L 23/532* (2006.01)
*H01L 21/768* (2006.01)
*H01L 23/522* (2006.01)

(52) U.S. Cl.
CPC .... *H01L 23/53238* (2013.01); *H01L 21/7682* (2013.01); *H01L 21/76801* (2013.01); *H01L 21/76808* (2013.01); *H01L 21/76811* (2013.01); *H01L 21/76879* (2013.01); *H01L 21/76885* (2013.01); *H01L 23/5222* (2013.01); *H01L 23/5226* (2013.01); *H01L 23/53257* (2013.01); *H01L 23/53295* (2013.01)

(58) Field of Classification Search
CPC ............. H01L 23/5226; H01L 23/5222; H01L 21/7682
See application file for complete search history.

(56) References Cited

U.S. PATENT DOCUMENTS

| | | | |
|---|---|---|---|
| 8,232,200 B1 | 7/2012 | Oh et al. | |
| 2006/0178002 A1 | 8/2006 | Kim et al. | |
| 2009/0197404 A1 | 8/2009 | Yang | |
| 2012/0248608 A1* | 10/2012 | Yoo | H01L 23/53238 257/751 |
| 2013/0093092 A1 | 4/2013 | Kanki et al. | |
| 2015/0325515 A1* | 11/2015 | Zhu | H01L 23/5228 257/758 |

FOREIGN PATENT DOCUMENTS

| KR | 20060090449 A | 8/2006 |
|---|---|---|
| KR | 1020100089902 A | 8/2010 |
| KR | 20120106545 A | 9/2012 |
| KR | 20130041730 A | 4/2013 |

\* cited by examiner

*Primary Examiner* — Matthew Landau
*Assistant Examiner* — Krista Soderholm
(74) *Attorney, Agent, or Firm* — Slater Matsil, LLP

(57) ABSTRACT

An embodiment semiconductor device includes a first conductive feature in a dielectric layer and a second conductive feature over the dielectric layer and electrically connected to the first conductive feature. The second conductive feature includes a dual damascene structure and further includes a top portion within both a line portion and a via portion of the second conductive feature and a bottom portion in the via portion of the second conductive feature. The bottom portion comprises a different conductive material than the top portion, and a thickness of the bottom portion is at least about twenty percent of a total thickness of the via portion of the second conductive feature.

20 Claims, 20 Drawing Sheets

INTERCONNECT STRUCTURES AND METHODS OF FORMING SAME

BACKGROUND

A typical semiconductor device includes a substrate having active devices such as transistors and capacitors. These active devices are initially isolated from each other, and interconnect structures are subsequently formed over the active devices to create functional circuits. Generally these interconnect structures include conductive features (e.g., metal lines and vias) formed in a plurality of stacked dielectric layers with interconnect structures in an upper layer extending down to electrically connect to interconnect structures in a lower layer. To reduce the capacitive coupling of conductive features in dielectric layers, low-k dielectric materials, including extra low-k dielectric materials are generally used for interconnect layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
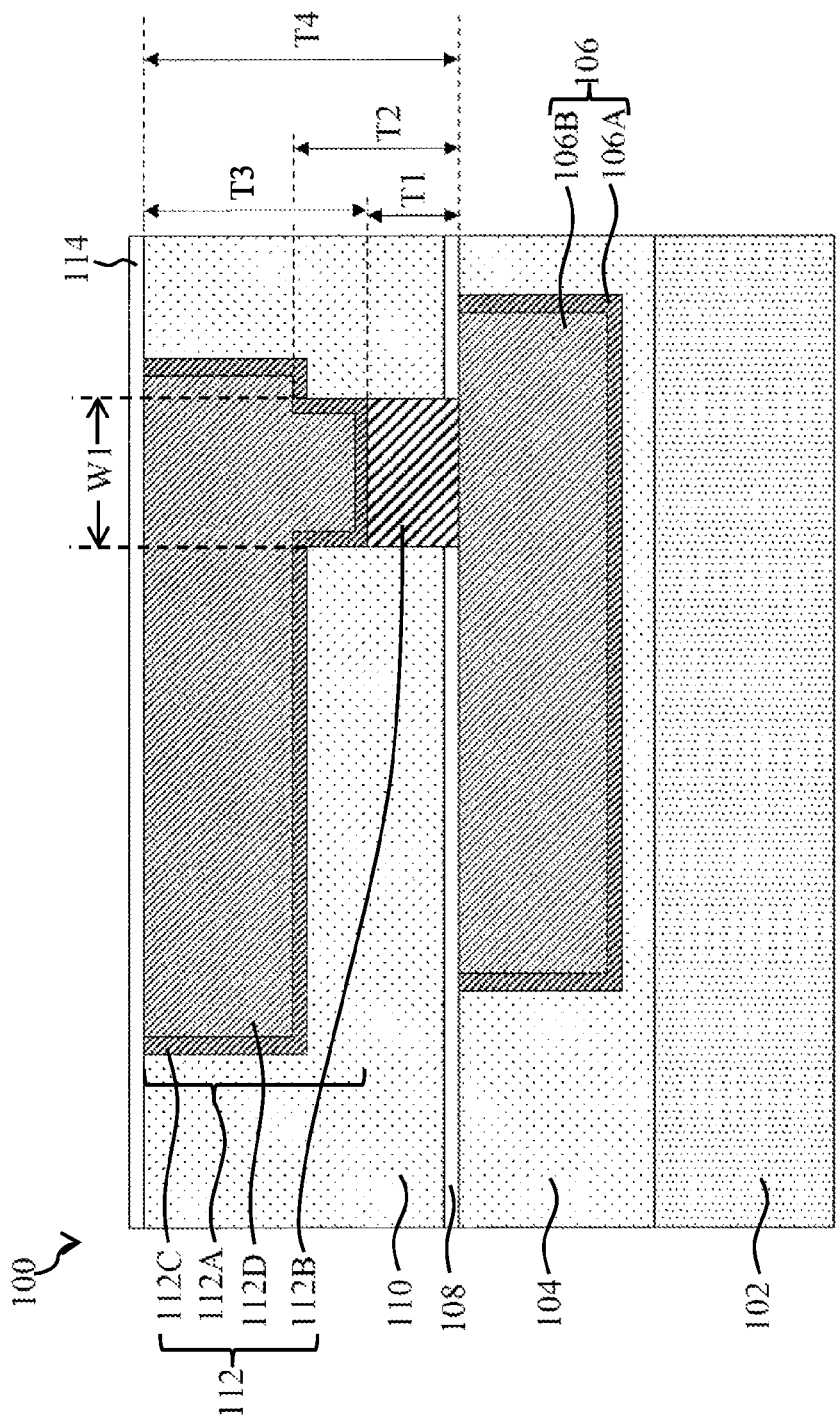
FIGS. 1A and 1B illustrate cross-sectional views of interconnect layers in a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include interconnect layers that provide improved structural integrity and electro-migration (EM) characteristics between adjacent conductive features. By configuring conductive features and dielectric layers according to example embodiments, various non-limiting advantages can be achieved. These advantages may include and combination of the following: improved interconnect EM reliability and robustness, improved time-dependent dielectric breakdown reliability and robustness, improved gap-filling process windows, reduced extra low-k (ELK) dielectric collapse and related issues, lower interconnect capacitance, and critical dimension (CD) enlargement (e.g., between conductive features) without trade-off ELK dielectric collapsing margin. Furthermore, such advantages may be achieved in a typical semiconductor fabrication environment without additional costly materials and/or fabrication tools.

Figure 1B:
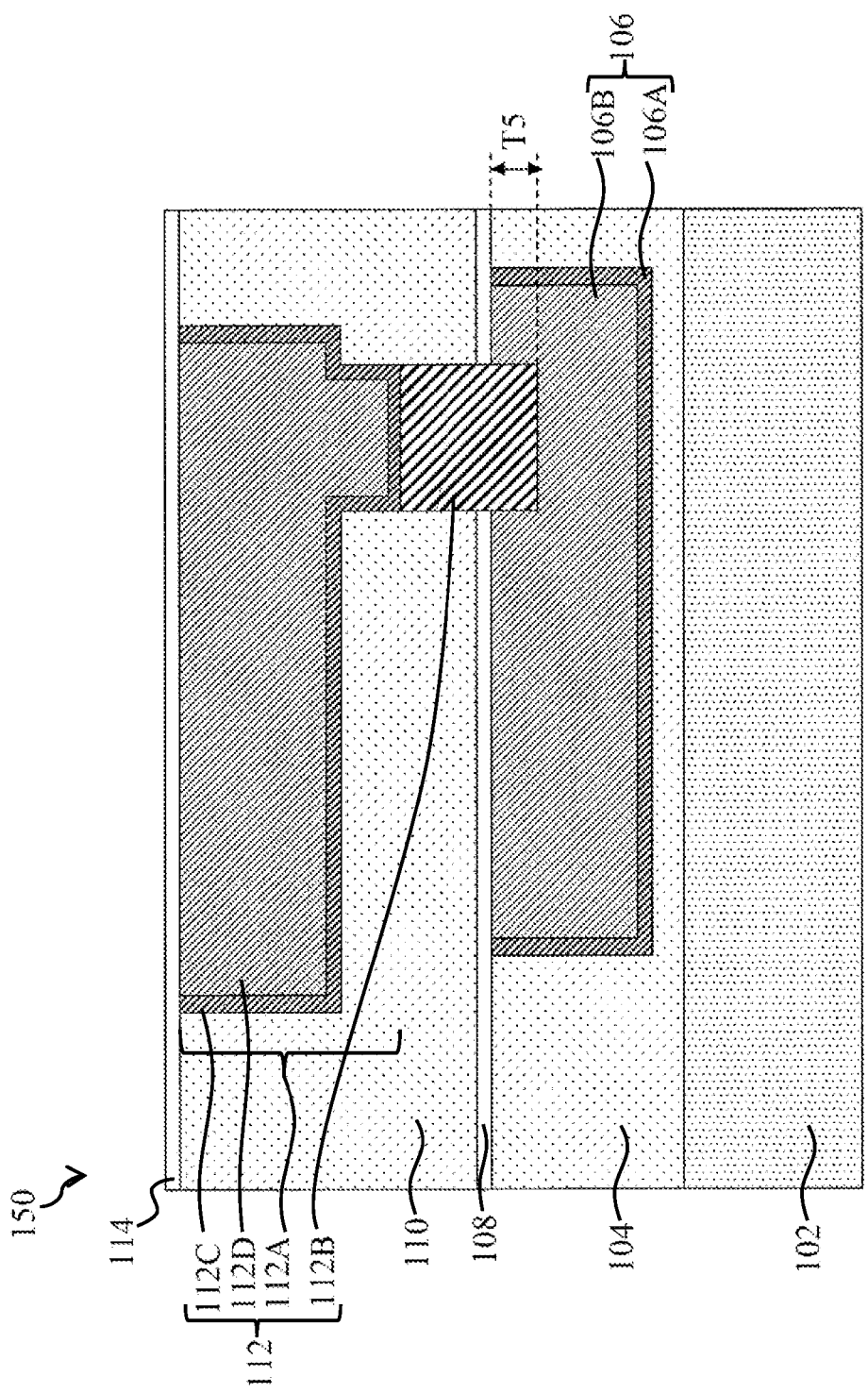

FIGS. 1A and 1B illustrate cross-sectional views of semiconductor devices 100 and 150 according to various embodiments. FIG. 1A illustrates a semiconductor device 100 having a substrate 102. Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, GaInAsP; or combinations thereof. Other substrates, such as multi-layered or gradient substrates, may also be used. Active devices (not shown), such as transistors, capacitors, diodes, and the like, may be formed on a top surface of substrate 102.

Dielectric layers 104 and 110 are formed over substrate 102 with dielectric layer 110 being formed over dielectric layer 104. Dielectric layers 104 and 110 may be inter-layer dielectric (ILD) and/or an inter-metal dielectric (IMD) layers formed over the substrate using any suitable method (e.g., chemical vapor deposition (CVD), plasma enhanced CVD (PECVD), or the like). Dielectric layer 104 may comprise ELK dielectric materials having a k value lower than about 2.5, for example. In some embodiments, dielectric layer 104 may comprise SiCO, SiCOH, and the like. Although FIG. 1 illustrates dielectric layer 104 as directly above and contacting substrate 102, there may be any number of additional layers (e.g., other dielectric layers having conductive interconnect features, etch stop layers, isolation layers, buffer layers, and the like) disposed between dielectric layer 104 and substrate 102.

Dielectric layer 104 may comprise at least a conductive feature 106 (e.g., a conductive line and/or via), may be electrically connected to active devices in substrate 102. Conductive feature 106 includes a conductive barrier layer 106A (e.g., comprising titanium nitride (TiN), titanium oxide (TiO), tantalum nitride (TaN), tantalum oxide (TaO), combinations thereof, and the like) formed around a conductive material 106B (e.g., comprising copper). Conductive barrier layer 106A may prevent (or at least reduce) diffusion of the conductive material 106B into the surrounding dielectric material. An etch stop layer 108 (e.g., comprising SiN, silicon carbide (SiC), silicon oxynitride (SiON), SiCO, and the like) is formed over conductive feature 106 and dielectric layer 104. In some embodiments, etch stop layer 108 may act as a protective layer for conductive feature 106 during the formation of various device features. In such embodiments, etch stop layer 108 is formed on a top surface of conductive feature 106, and etch stop layer 108 may be disposed between dielectric layers 104 and 110.

Dielectric layer 110 comprises at least a conductive feature 112, which may comprise a dual damascene structure having a conductive line disposed over and smoothly connected to a conductive via with no interface formed therebetween. Conductive feature 112 further includes a top portion 112A and a bottom portion 112B. Top portion 112A may include a conductive barrier layer 112C (e.g., comprising TiN, TiO, TaN, TaO, and the like) formed around a conductive material 112D (e.g., comprising copper). Top portion 112A is disposed within both conductive line and conductive via portions of the conductive feature 112, and no interface may be formed within conductive material 112D. For example, top portion 112A has a dual damascene configuration. Bottom portion 112B of conductive feature 112 comprises a high EM resistance material (e.g., cobalt (Co), tantalum (Ta), TaN, and the like) formed using an electroless plating method, for example. The high EM resistance material may be used to increase the EM resistance of underlying conductive feature 106, and the resistance value may be correlated to the adhesion between bottom portion 112B and conductive feature 106.

Conductive barrier layer 112C may be disposed between bottom portion 112B and conductive material 112D. Bottom portion 112B is disposed within a conductive via portion of conductive feature 112, and bottom portion 112B may contact and electrically connect to a top surface of underlying conductive feature 106. A protective etch stop layer 114 (e.g., comprising SiN, SiC, SiOH, SiCO, and the like) may be disposed over dielectric layer 110 and conductive feature 112.

In some embodiments, thickness T1 of bottom portion 112B may make up about 20% to about 40% of a total thickness T2 of the conductive via portion of conductive feature 112. For example, thickness T1 may be about 90 Å to about 180 Å while thickness T2 may be about 450 Å to about 900 Å. As will be described in greater detail below, by configuring bottom portion 112B to have the above dimensions, the aspect ratio of conductive feature 112 is lowered even at conductive feature 112's narrowest point, thus reducing the risk of forming voids in conductive feature 112 during metallization. For example, an aspect ratio of filling conductive feature 112 at a narrowest point is reduced from a total aspect ratio of conductive feature 112 (e.g., thickness T4 over width W1) to just the aspect ratio of top portion 112A (e.g., thickness T3 over width W1). In some embodiments, such as device 150 in FIG. 1B, bottom portion 112B may further extend into the underlying conductive feature 106 to increase contact area between conductive features 112 and 106, which advantageously reduces contact resistance. For example, bottom portion 112B may extend a depth T5 within underlying conductive feature 106B, and depth T5 may be about 0 Å to about 100 Å.

Figure 2:
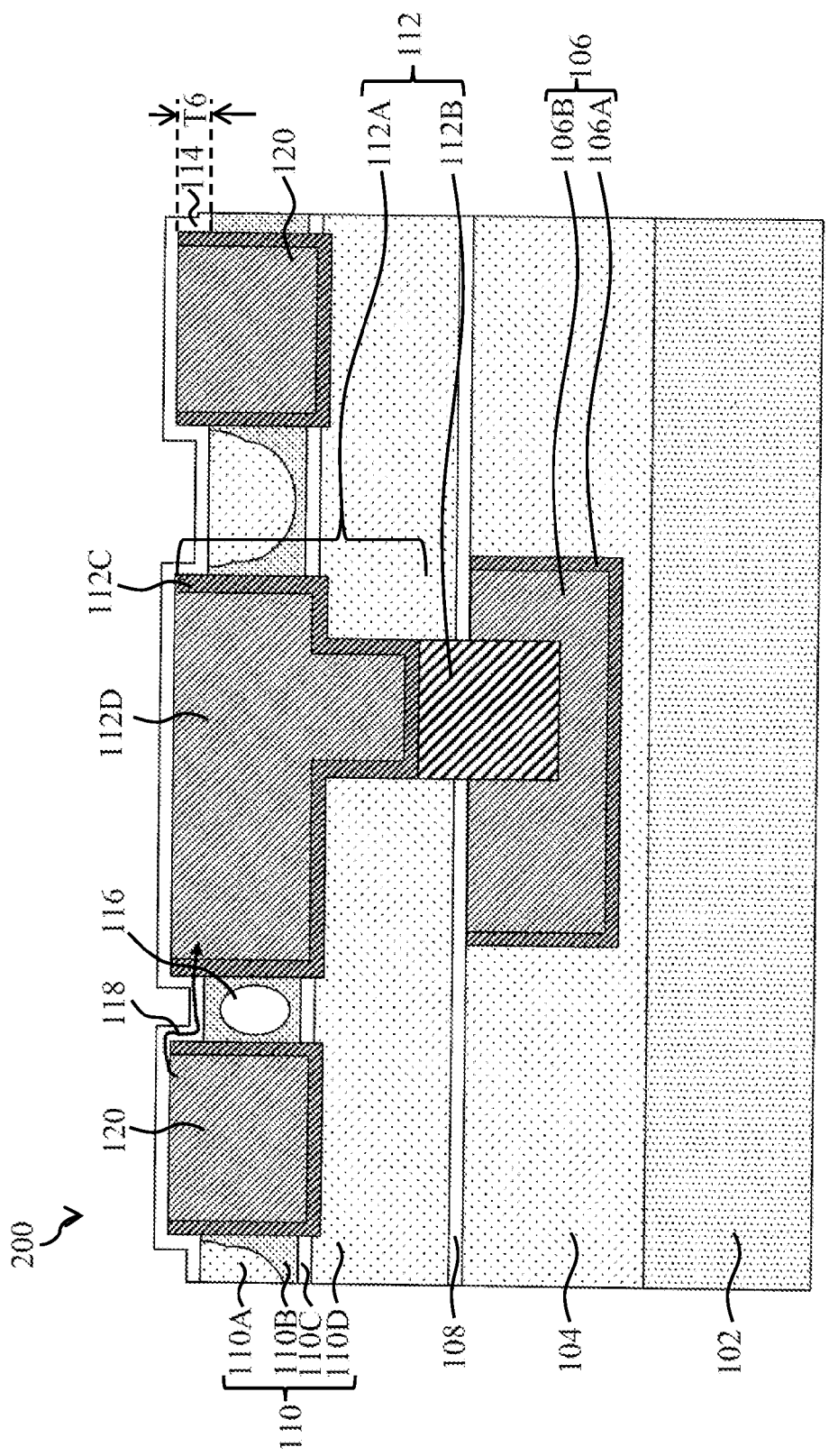
FIG. 2 illustrates a cross-sectional view of interconnect layers in a semiconductor device in accordance with some other embodiments.

Various embodiments may further include additional features to improve the structural integrity and/or EM characteristics of interconnect layers. For example, FIG. 2 illustrates a device 200 according to some embodiments. Device 200 may be similar to devices 100 and 150 where like reference numerals indicate like elements. For example, device 200 includes dielectric layers 104 and 110 comprising conductive features 106 and 112, respectively. At least a bottom portion 112B of conductive feature 112 comprises a high EM resistance material (e.g., Co, Ta, TaN, and the like). Dielectric layer 110 may further include additional conductive features, such as conductive lines 120.

In device 200, dielectric layer 110 is a multilayered dielectric comprising layers 110A through 110D, for example. Dielectric layer 110D comprises an ELK material as described above. An etch stop layer 110C (e.g., similar to etch stop layer 108) is disposed over dielectric layer 110D. A reinforcement layer 110B is disposed over etch stop layer 110C, and an ELK layer 110A is disposed over reinforcement layer 110B. In some embodiments reinforcement layer 110B comprises a dielectric having better structural integrity (e.g., increased density and/or less porousness) than dielectric layer 110D or ELK layer 110A. For example, reinforcement layer 110B may comprise undoped silicate glass (USG), oxygen doped SiC (ODC), nitrogen doped SiC (NDC), tetraethylorthosilicate (TEOS), or the like. Reinforcement layer is deposited along sidewalls of conductive features 112/conductive lines 120 as structural support. Thus, dielectric layer collapse and related issues may be reduced even in high aspect ratio areas of in device 200.

In some embodiments, a dielectric constant of reinforcement layer 110B may be higher than dielectric layer 110D/ELK layer 110A. Therefore, voids 116 may be formed in reinforcement layer 110B to lower its dielectric constant. Such voids may be formed as part of reinforcement layer 110B's deposition process in areas where the aspect ratio between adjacent features (e.g., conductive line 120 and conductive feature 112) is relatively high (e.g., greater than one). In areas where the aspect ratio between adjacent features is lower, ELK layer 110A is deposited as a filler to lower the overall effective dielectric constant of layer 110.

As further illustrated by FIG. 2, conductive feature 112 and conductive lines 120 may extend over a top surface of dielectric layer. For example, top surfaces conductive feature 112 and conductive lines 120 may be higher than a top surface of dielectric layer 110 by a distance T6 of about 1 Å to about 100 Å. In some embodiments, bottom surfaces of conductive lines 120 and conductive line portions of conductive feature 112 may be also be lower than etch stop layer 110C. Protective etch stop layer 114 (e.g., comprising SiN, SiC, SiON, SiCO, and the like) is disposed over top surfaces of conductive feature 112/conductive lines 120, and protective etch stop layer 114 may further extend at least along upper sidewalls of conductive feature 112/conductive lines 120. By configuring protective etch stop layer 114 as a non-planar layer as illustrated, ion diffusion distance to neighboring conductive features within protective etch stop layer 114 (as indicated by arrow 118) may be increased compared to planar etch stop layers (see e.g., FIGS. 1A and 1B). For example, when conductive line comprises copper, copper ion diffusion distance within layer 114 to conductive feature 112 is increased. It has been observed that by increasing ion diffusion distance, TDDB performance is enhanced in device 200, even as spacing between adjacent conductive features is reduced in advanced technology nodes.

Figure 3:
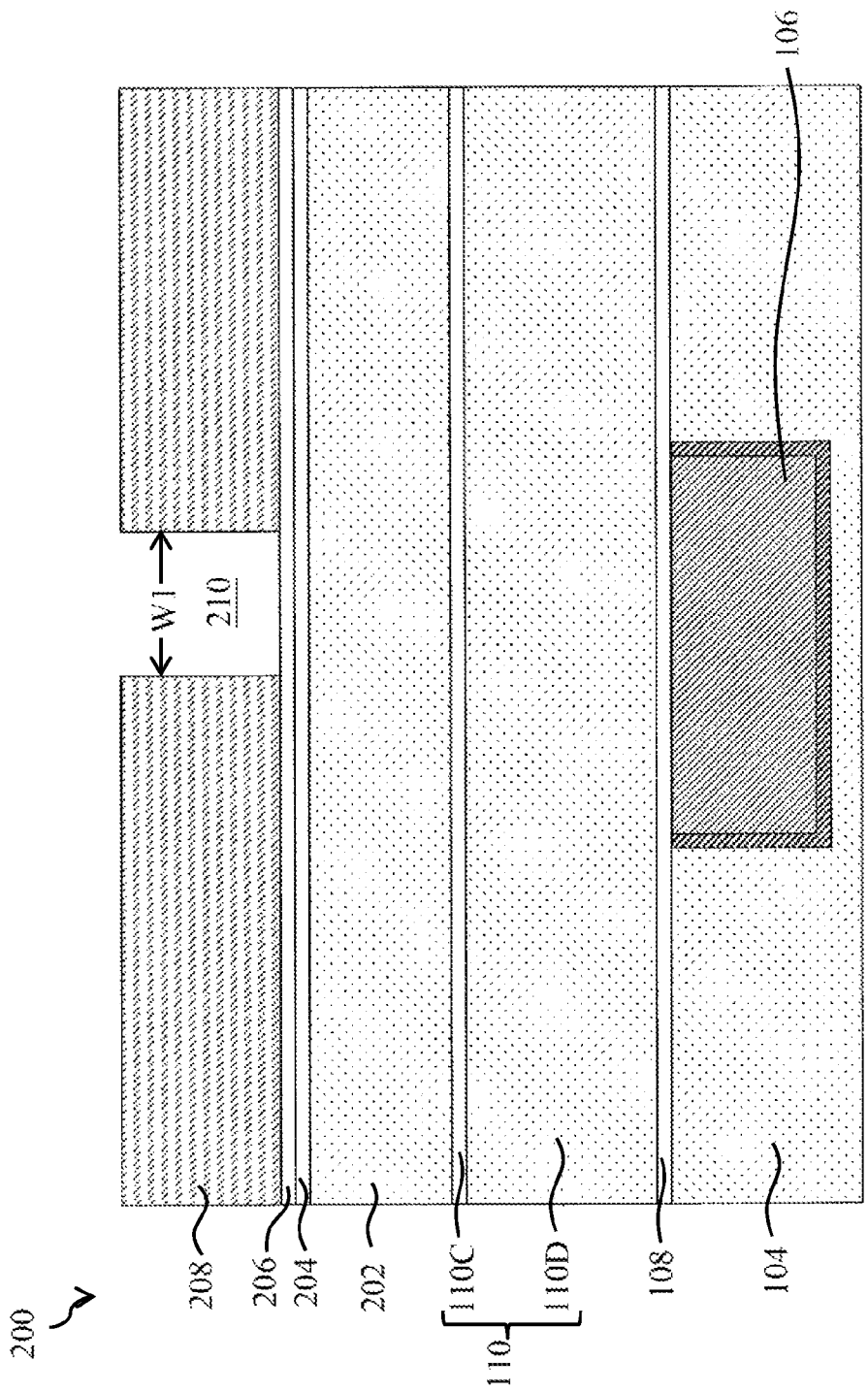
FIGS. 3 through 6 illustrate various intermediary stages of patterning interconnect layers in a semiconductor device in accordance with some embodiments.

FIGS. 3 through 13 illustrate cross-sectional views of various intermediary stages of forming device 200 according to some embodiments. In FIGS. 3 through 6, a dual damascene opening is patterned in multiple dielectric layers using a via-first approach. In FIG. 3, various device features (e.g., dielectric layer 104 comprising conductive feature 106, etch stop layer 108, dielectric layer 110D, and etch stop layer 110C) as described above are provided. A sacrificial layer 202 (e.g., comprising a dielectric material) is formed over etch stop layer 110C, and a hard mask 204 (e.g., comprising SiO, SiN, and the like) is formed over sacrificial layer 202. Sacrificial layer 202 and hard mask 204 may be formed using any suitable process such as CVD, PECVD, and the like. As further illustrated by FIG. 3, bottom anti-reflective coating (BARC) layer 204 and a photoresist 208 is formed over hard mask 204. BARC 206 and photoresist 208 are formed to aid in the patterning of the hard mask 204. For example, BARC 206 helps filter reflection from underlying layers during photolithography, and photoresist 208 may be used to transfer a pattern to hard mask 204.

In FIG. 3, photoresist 208 is patterned to include a via opening 210 having a first width W1. In various embodiments, width W1 may correspond to a desired width of via portions of subsequently formed dual damascene conductive features (e.g., conductive feature 112, see FIG. 2). The photolithography process may include, for example, exposing portions of the photoresist 208 through a lithography mask using ultraviolet light, for example. Subsequently, exposed or unexposed portions of photoresist 208 are developed and removed depending on whether a positive or negative resist is used. Via opening 210 may be aligned with conductive feature 106 in dielectric layer 104.

Figure 4:
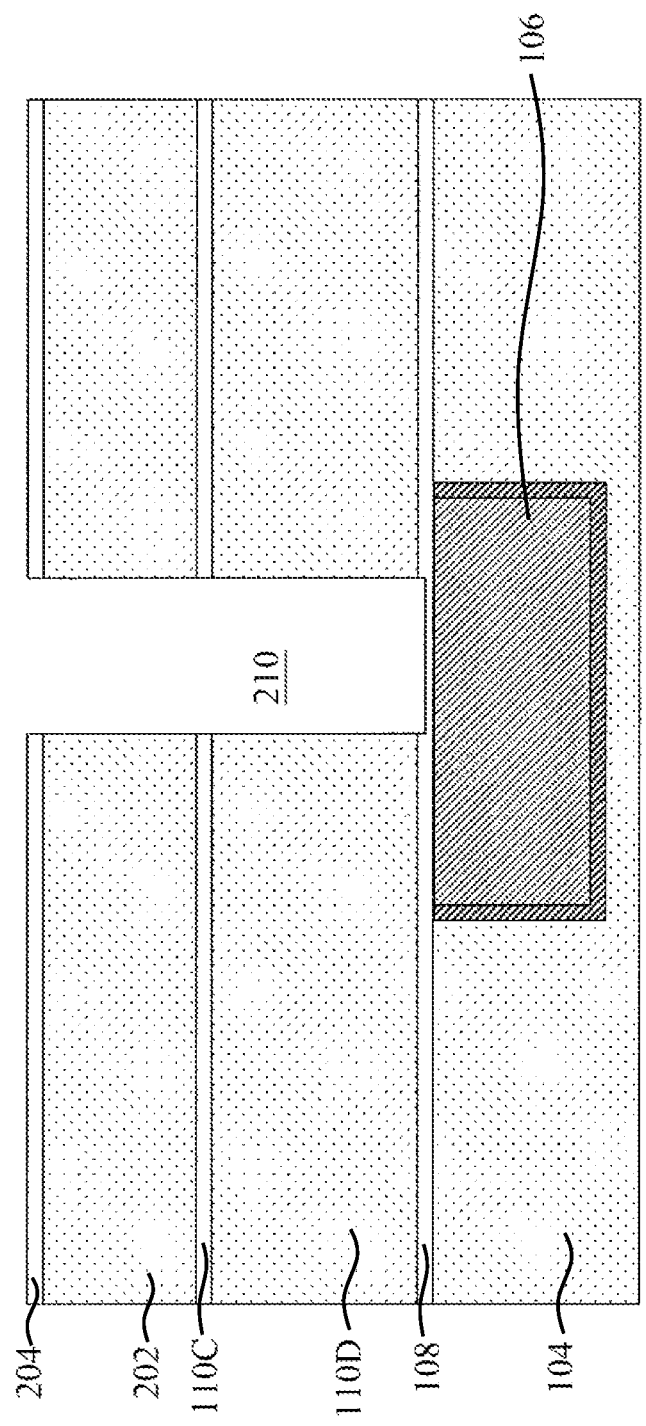

The pattern of photoresist 208 is transferred to hard mask 204 using a suitable etching process, for example. Hard mask 204 is then used to etch underlying sacrificial layer 202, etch stop layer 110C, dielectric layer 110D, and etch stop layer 108. The etching of various layers may include multiple etching processes using same or different process conditions. Thus, via opening 210 is formed extending through hard mask 204, sacrificial layer 202, etch stop layer 110C, and dielectric layer 110D. Via opening 210 may further extend into etch stop layer 108. In other embodiments via opening 210 may stop above etch stop layer 108 or extend through etch stop layer 108. Subsequently, photoresist 208 and BARC 206 are removed using any suitable process(es). For example, photoresist 208 may be removed a plasma ashing or wet strip process. Optionally, the plasma ashing process may be followed by a wet dip in a sulfuric acid ($H_2SO_4$) solution to clean device 200 and remove remaining photoresist material. The resulting structure is illustrated in FIG. 4.

Figure 5:
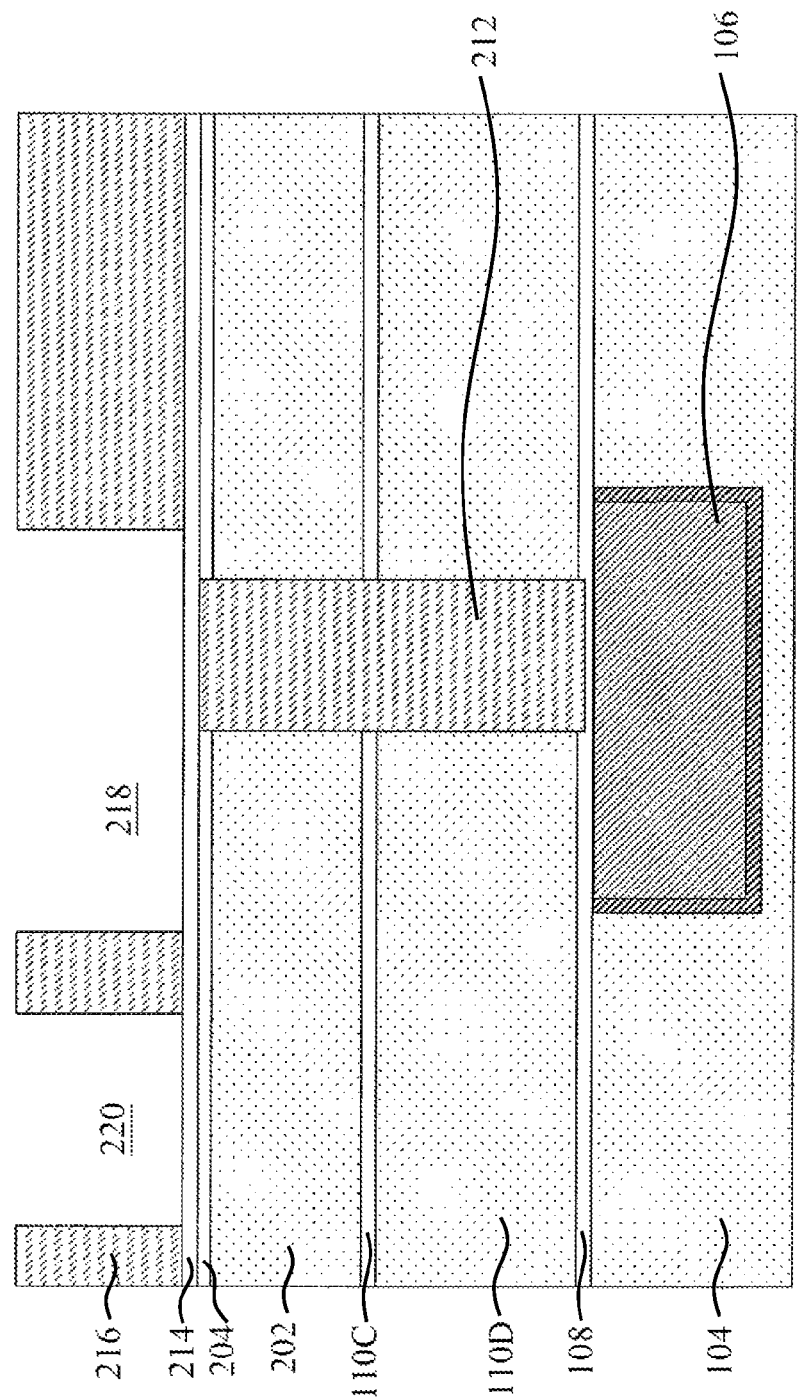

In FIG. 5, via opening 210 is filled with a sacrificial material 212 (e.g., a photoresist). After, via opening 210 is filled, a second BARC layer 214 and patterned photoresist 216 is formed over hard mask 204 and sacrificial material 212. Photoresist 216 includes trench opening 218 having a width W2, and trench opening 218 may be aligned with underlying sacrificial material 212. In various embodiments, width W2 may correspond to a desired width of a subsequently formed conductive line portion of a dual damascene conductive feature (e.g., conductive feature 112, see FIG. 2). Photoresist 216 may further include additional trench openings 220, which may not be aligned with sacrificial material 212. A location of openings 220 may be determined based on a desired placement of additional conductive lines (e.g., conductive lines 120) in various dielectric layers.

Figure 6:
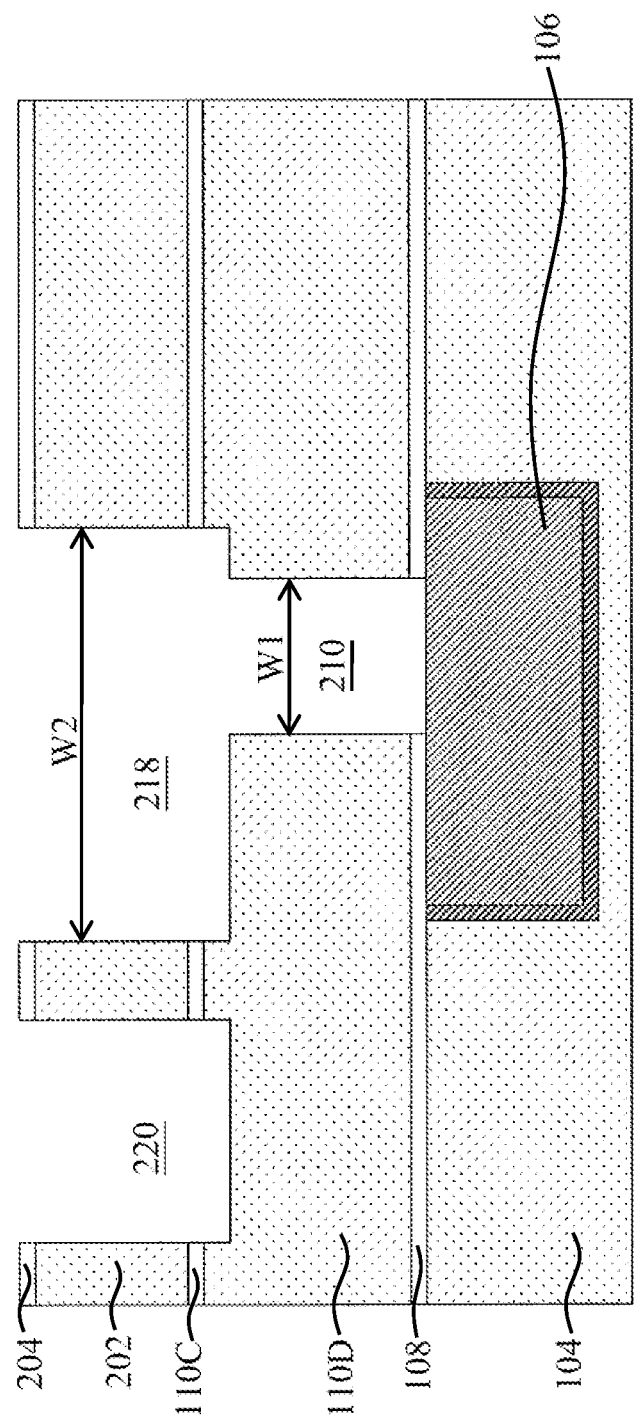

The pattern of photoresist 216 is transferred to hard mask 204 (e.g., through etching), which is used to etch underlying sacrificial layer 202, etch stop layer 110C, and dielectric layer 110D. The etching of various etch stop layers and dielectric layers may include multiple etching processes at same or different process conditions. In some embodiments, a time mode etch process is used so that the etching process etches a predetermined depth. In the resulting structure, trench openings 218 and 220 extend through sacrificial layer 202 and etch stop layer 110C into dielectric layer 110D. Subsequently, photoresist 208, sacrificial material 212, and BARC 206 are removed using any suitable process(es) as described above. The resulting structure is illustrated in FIG. 6. As illustrated in by FIG. 6, openings 218 and 210 are connected and expose conductive feature 106. Width W2 of trench opening 218 is greater than width W1 of via opening 210. In some embodiments, after conductive feature 106 is exposed, an additional etching may be performed to further etch conductive feature 106 to a desired depth. Thus, a via-first patterning method may be used to form a dual damascene opening in multiple dielectric layers.

Figure 7:
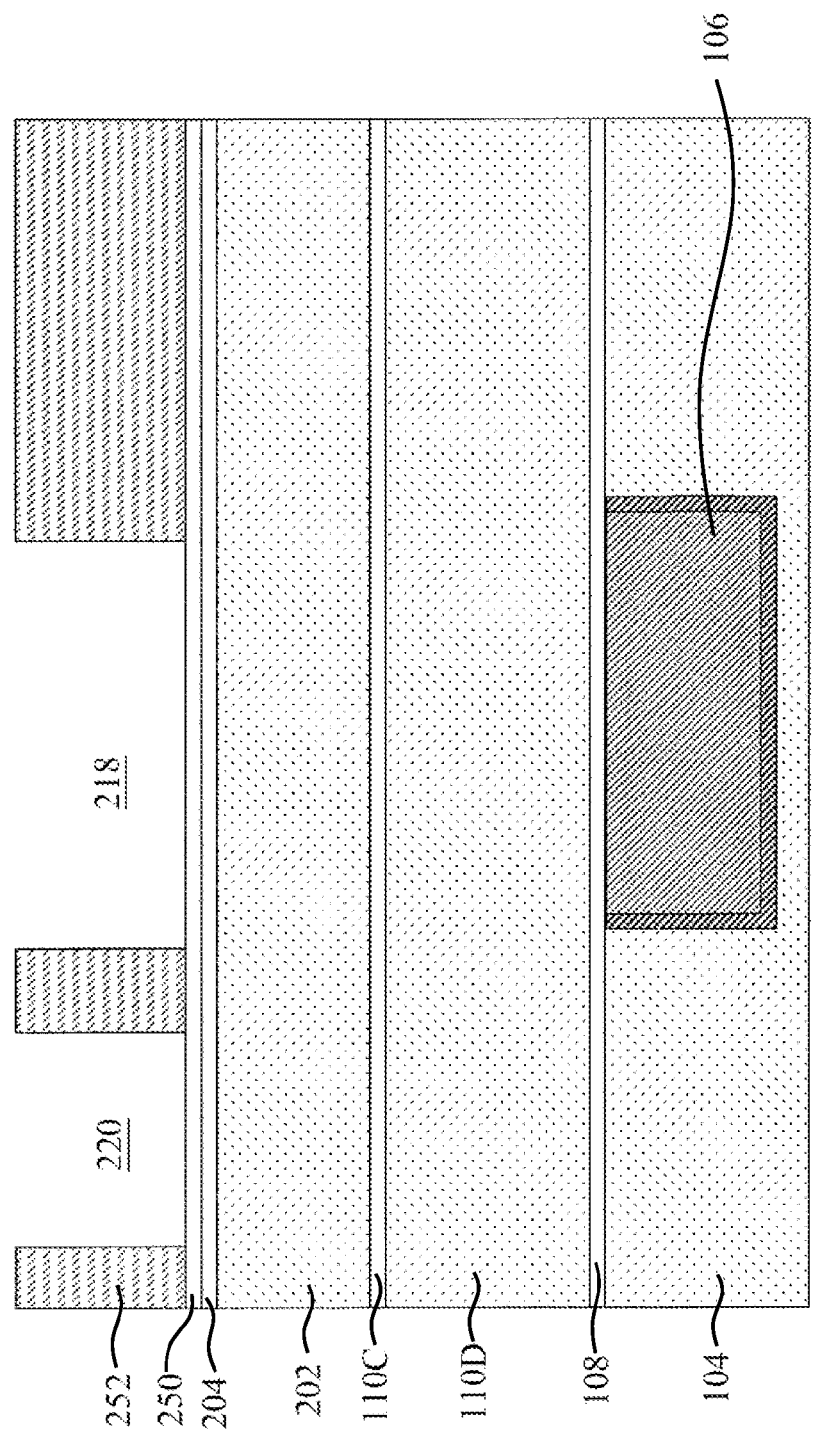
FIGS. 7 through 11 illustrate various intermediary stages of patterning interconnect layers in a semiconductor device in accordance with some other embodiments.

In other embodiments, a trench-first patterning method may be used to form a dual damascene opening in multiple dielectric layers. For example, FIGS. 7 through 11 illustrate various intermediary stages of manufacturing such an opening using a trench-first method. Referring first to FIG. 7, various dielectric layers as described above are provided where like reference numbers indicate like elements. Specifically, FIG. 7 illustrates a dielectric layer 104 having a conductive feature 106, an etch stop layer 108, a dielectric layer 110D, an etch stop layer 110C, a sacrificial layer 202, and a hard mask 204. A photoresist 252 and a BARC layer 250 are formed over hard mask 204. Photoresist 252 is patterned as described above to include trench openings 220 and 218.

Figure 8:
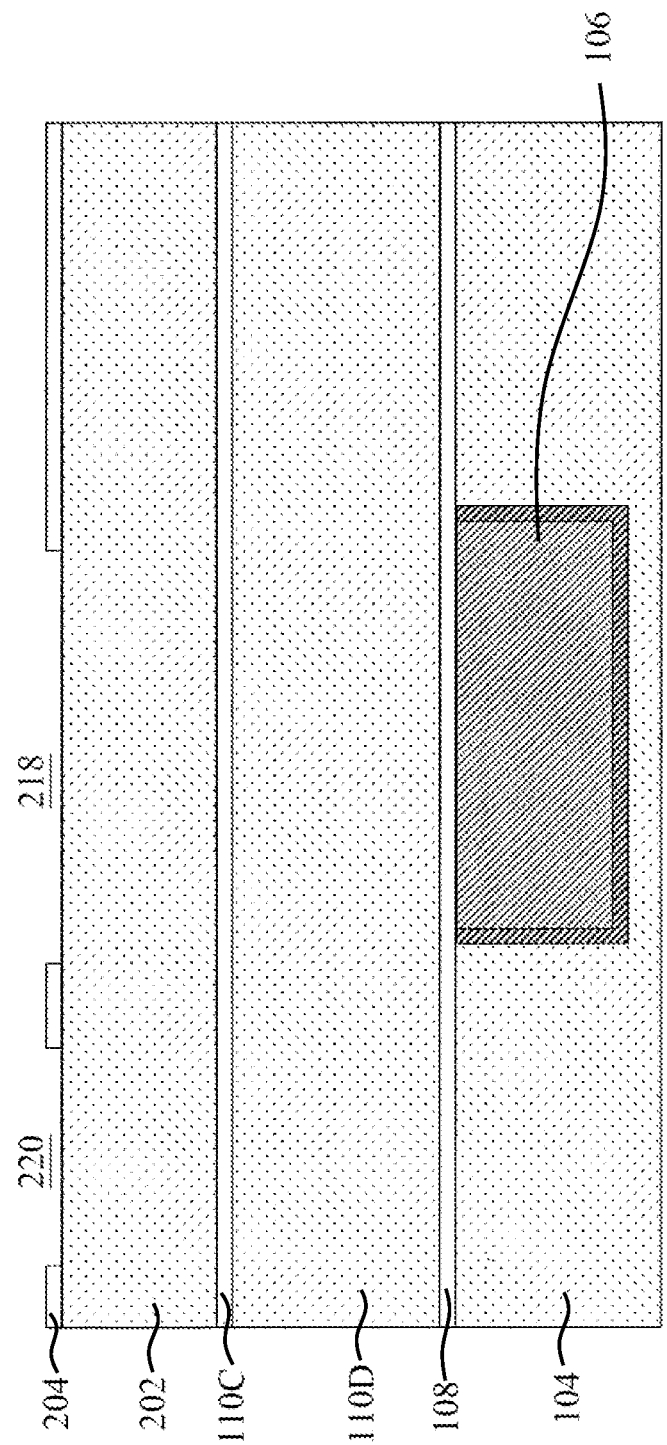
Figure 9:
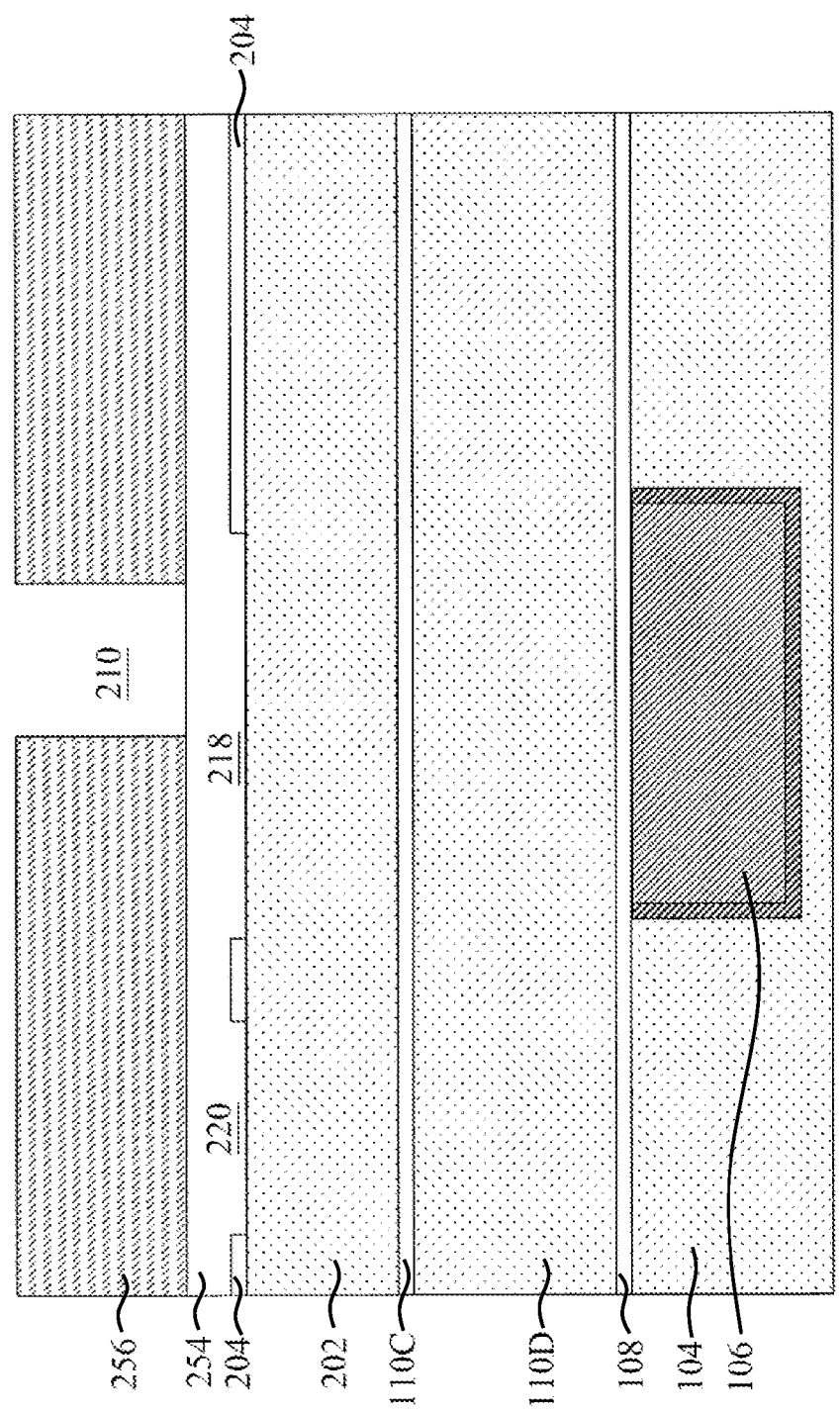

In FIG. 8, a pattern of photoresist 252 is transferred to hard mask 204 by etching, for example. Thus, trench openings 220 and 218 are patterned in hard mask 204. As also illustrated by FIG. 8, photoresist 252 and BARC 250 may then be removed as described above. In FIG. 9, a second hard mask 254 is deposited over hard mask 204 using a blanket deposition process, for example. Hard mask 254 may fill openings 218 and 220. In some embodiments, hard mask 254 comprises a different material than hard mask 204. For example, the material of hard mask 254 may allow for it to be selectively etched without etching hard mask 204. A second photoresist 256 is formed over hard mask 254, and photoresist 256 may be patterned to include a via opening 210 as described above. Via opening 210 is narrower than trench opening 218, and via opening 210 may be vertically aligned with trench opening 218.

Figure 10:
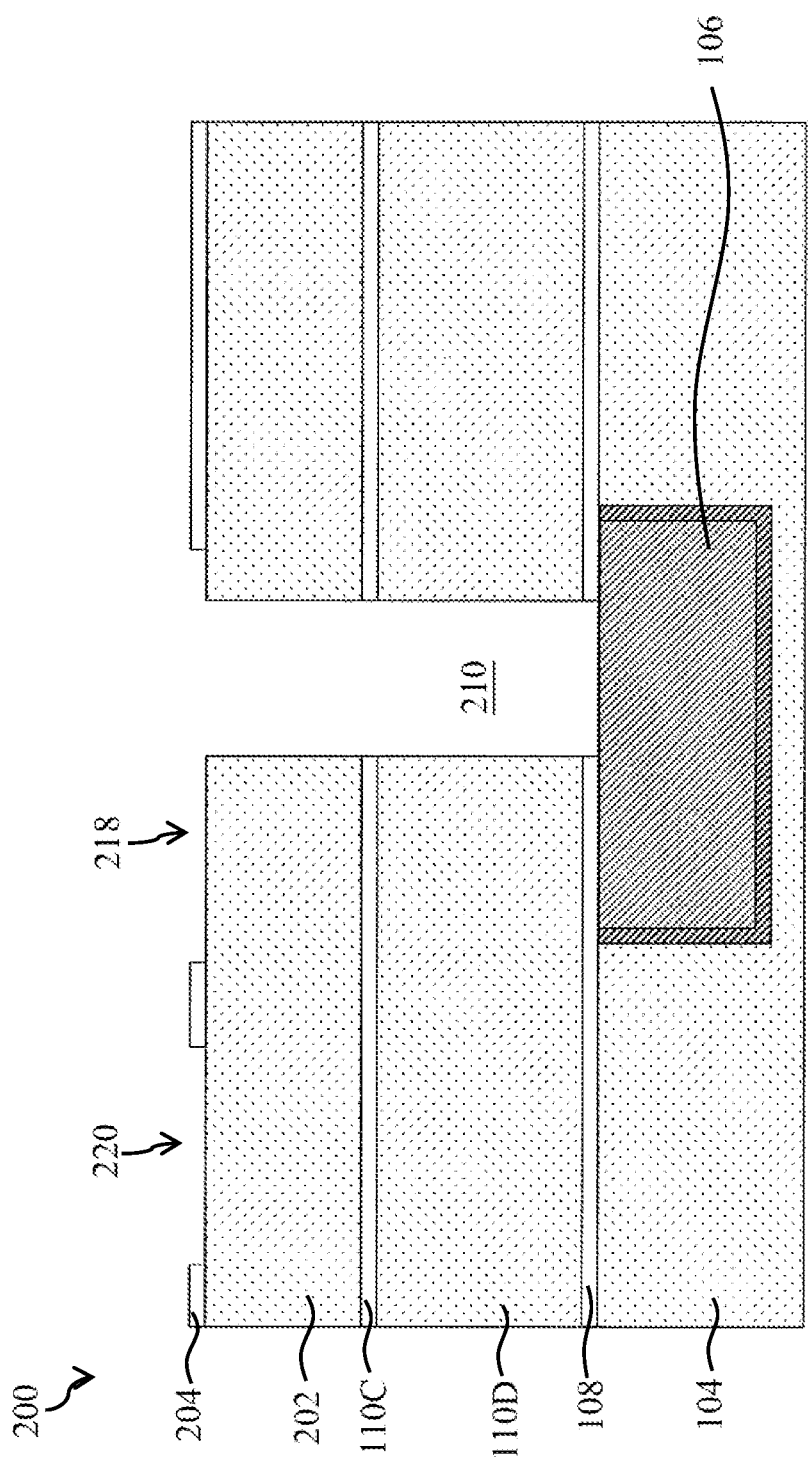
Figure 11:
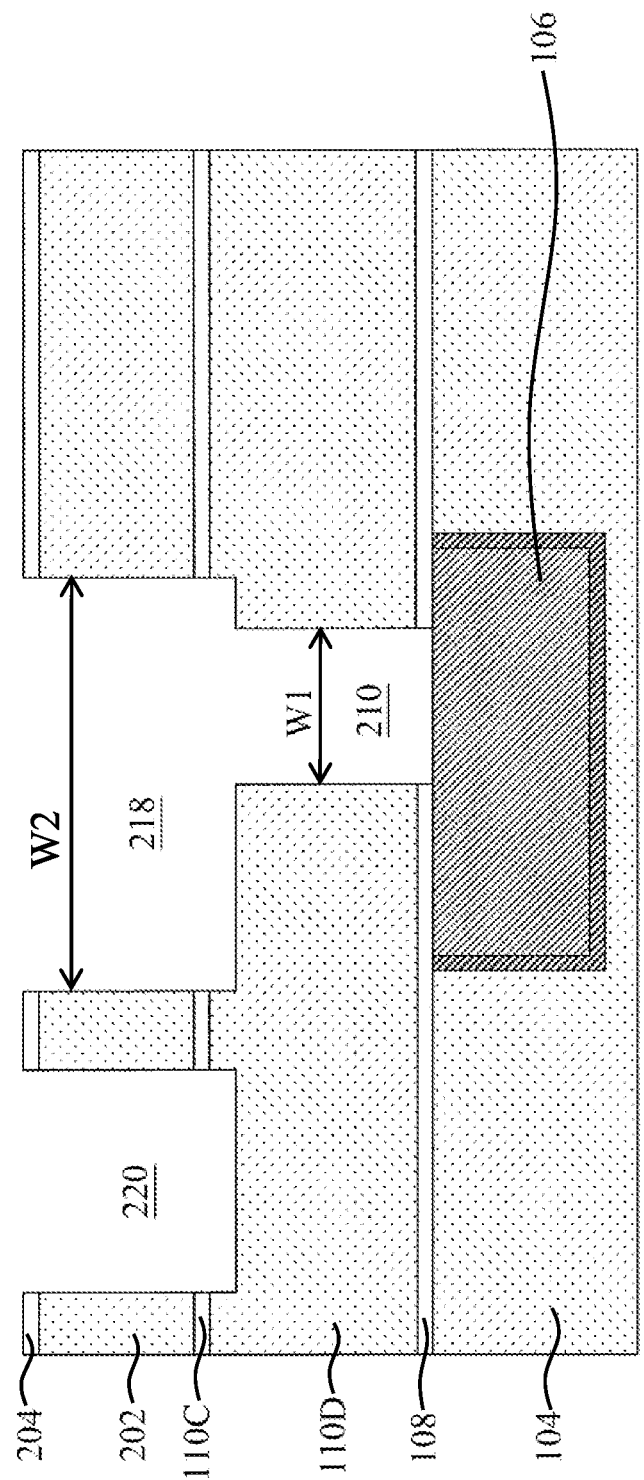

A pattern of photoresist 256 may be transferred to hard mask 254, which may be used as a patterning mask to etch underlying dielectric layers as described above. FIG. 10 illustrates device 200 after etching via opening 210 through sacrificial layer 202, etch stop layer 110C, dielectric layer 110D, and etch stop layer 108 as described above. Opening 210 exposes conductive feature 106 in dielectric layer 104. In some embodiments, opening 210 may further be extended into conductive feature 106 by etching (not illustrated). Hard mask 254 is then removed using any suitable technique to expose hard mask 204 having trench openings 220 and 218. Subsequently, in FIG. 11, one or more additional etchings may be used to extend openings 220 and 218 through sacrificial layer 202, through etch stop layer 110D, and partially though dielectric layer 110C. Thus, a dual damascene opening is formed in multiple dielectric layers using a trench-first approach.

Figure 12:
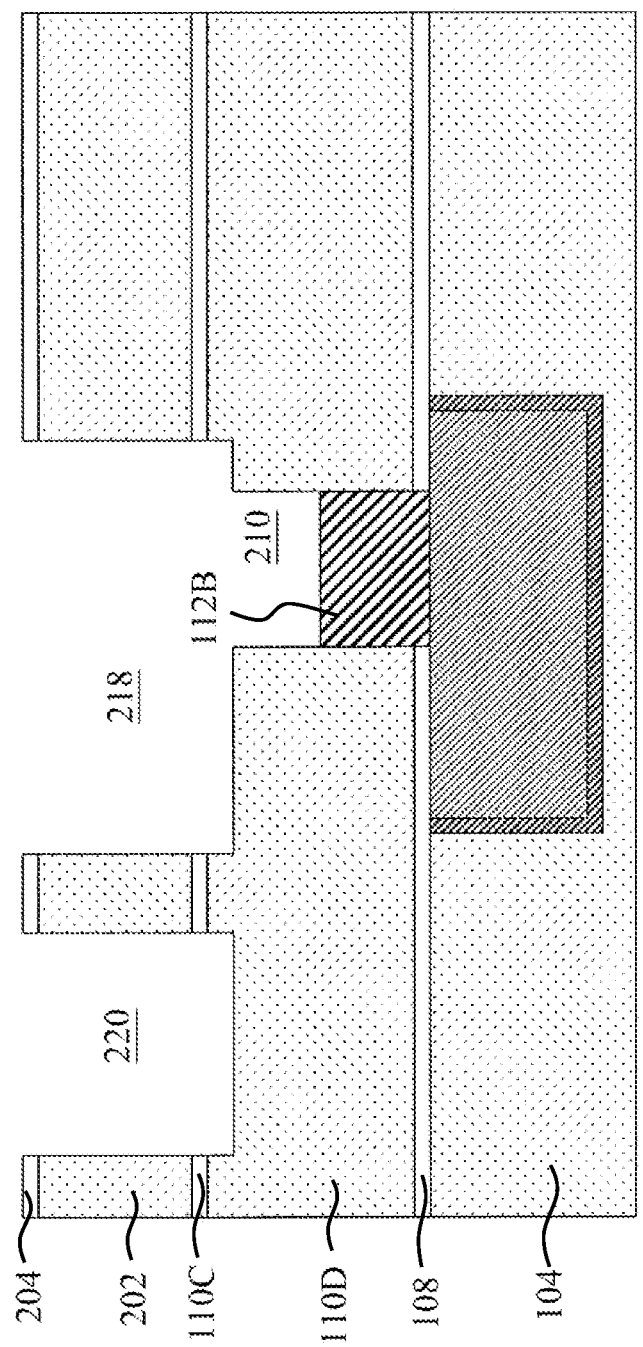
FIGS. 12 through 18 illustrate various intermediary stages of forming features of interconnect layers in a semiconductor device in accordance with some embodiments.
Figure 13:
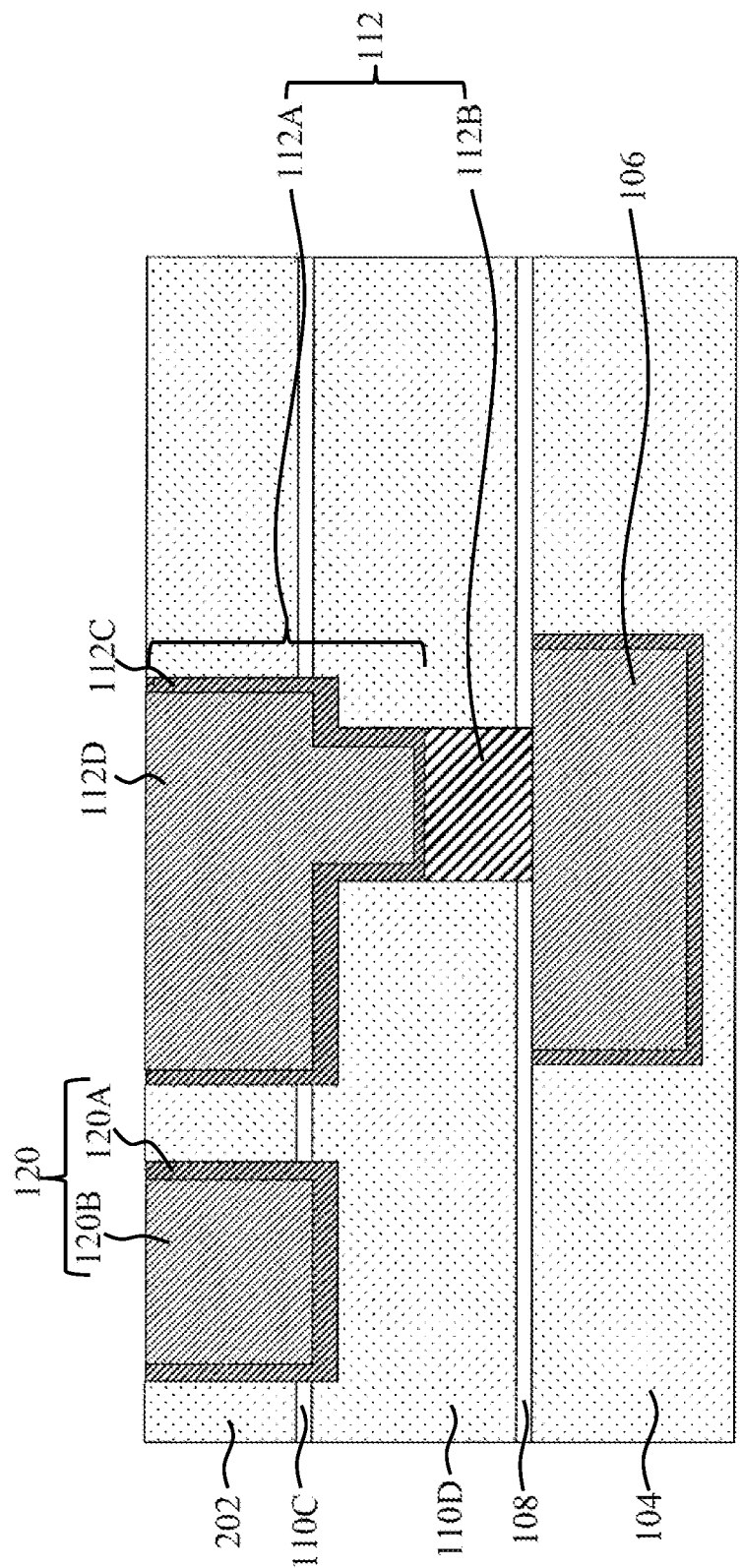

FIGS. 12 and 13 illustrate various intermediary steps of filling openings 218, 220, and 210 with a conductive material according to some embodiments. Referring next to FIG. 12, via opening 210 is partially filled with a high EM resistance material to form a bottom portion 112B of the conductive feature. For example, bottom portion 112B comprises Co, Ta, TaN, and the like, and at least about 20% of via opening 210 is filled with the high EM resistance material. In an embodiment, about 20% to about 40% of via opening 210 is filled with the high EM resistance material. The deposition of bottom portion 112B may include electroless plating. In such embodiments, conductive feature 106, which is exposed by opening 210, provides nucleation sites during the electroless plating process to allow for bottom up growth of the high EM resistance material without depositing a seed layer. The electroless plating method does not deposit conductive materials on exposed dielectric surfaces (e.g., bottom surfaces of openings 220 and 218) due to the lack of suitable nucleation sites on the dielectric material. It has been observed that by using this plating method (e.g., without a seed layer) and forming bottom portion 112B to the above heights, voids may be eliminated (or at least reduced) in a resulting conductive feature 112.

In FIG. 13, trench opening 218, trench opening 220, and a remainder of via opening 210 are filled with conductive materials to form conductive feature 112 and conductive line 120. For example, conductive barrier layers 120A and 112C are formed in openings 218, 220, and 210 comprising, for example, TaN, TaO, TiN, TiO, and the like by CVD, PECVD, or another deposition process. Conductive feature 112 and conductive line 120 are created by filling the openings with a conductive material such as copper, aluminum (Al), aluminum copper alloy (AlCu), gold, titanium, cobalt, an alloy, or another conductive material. In some embodiments, conductive feature 112 and conductive line 120 are formed through, for example, electrochemical plating (ECP), electroplating, electroless plating or another process. In such embodiments, a seed layer (not shown) is formed over the conductive barrier layers 120A/112C by for example, atomic layer deposition. The seed layer provides nucleation sites for the plating process. By first partially filling via opening 210 with high EM resistance material 112C, the aspect ratio of forming remaining portions of conductive feature 112 is lowered, reducing the risk of forming voids during plating and improving the EM characteristics of the resulting conductive feature.

In some embodiments, the conductive materials 120B and 112D are formed to overflow openings 218 and 220. Such overfilling is used, for example, to ensure that the openings 218 and 220 are completely filled. Excess material is removed by grinding, chemical mechanical polish (CMP), polishing, etching or another reduction process. The removal of the excess material may further remove hard mask 204 and, in some embodiments, even reduce sacrificial layer 202 to a desired depth. After planarization, top surfaces of conductive feature 112 and conductive line 120 are substantially planar with the top surface of sacrificial layer 202.

Figure 14:
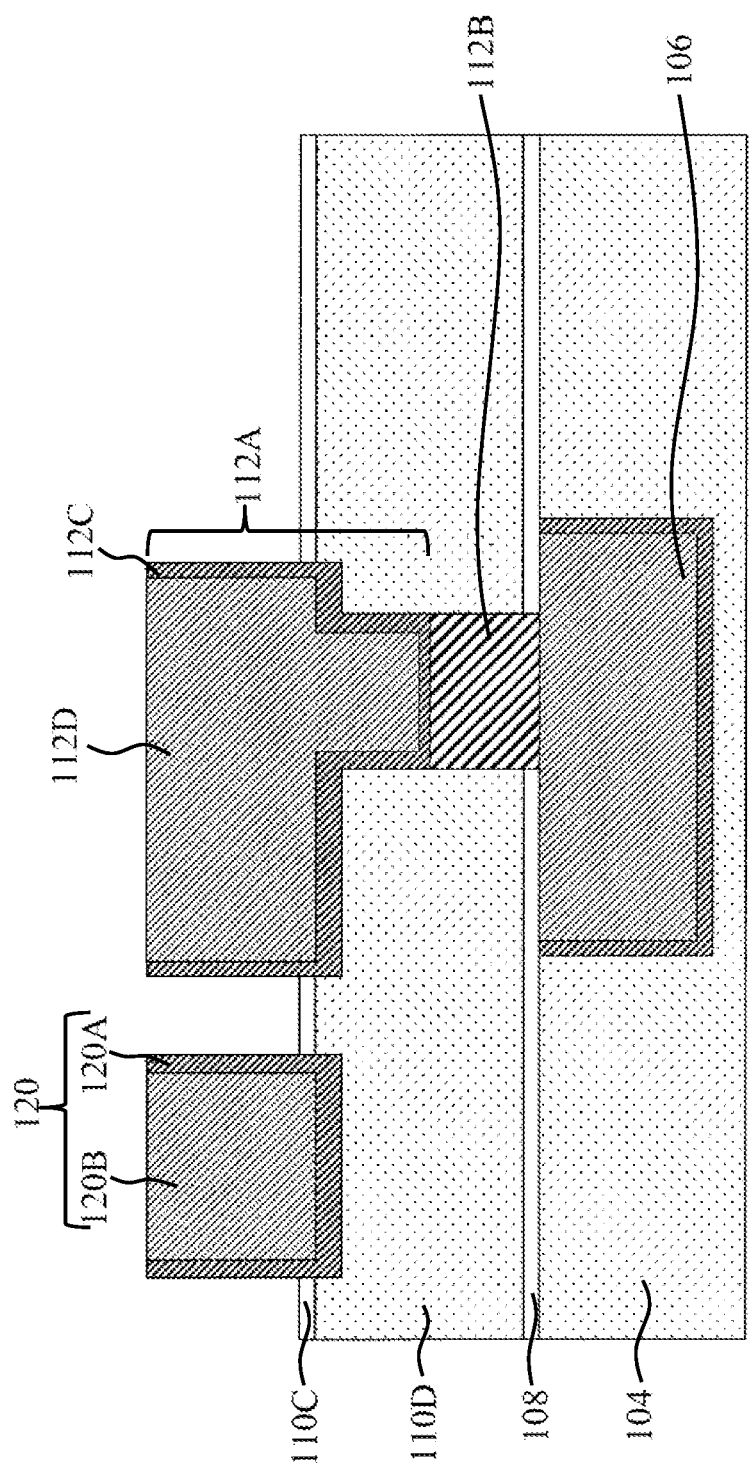
Figure 15:
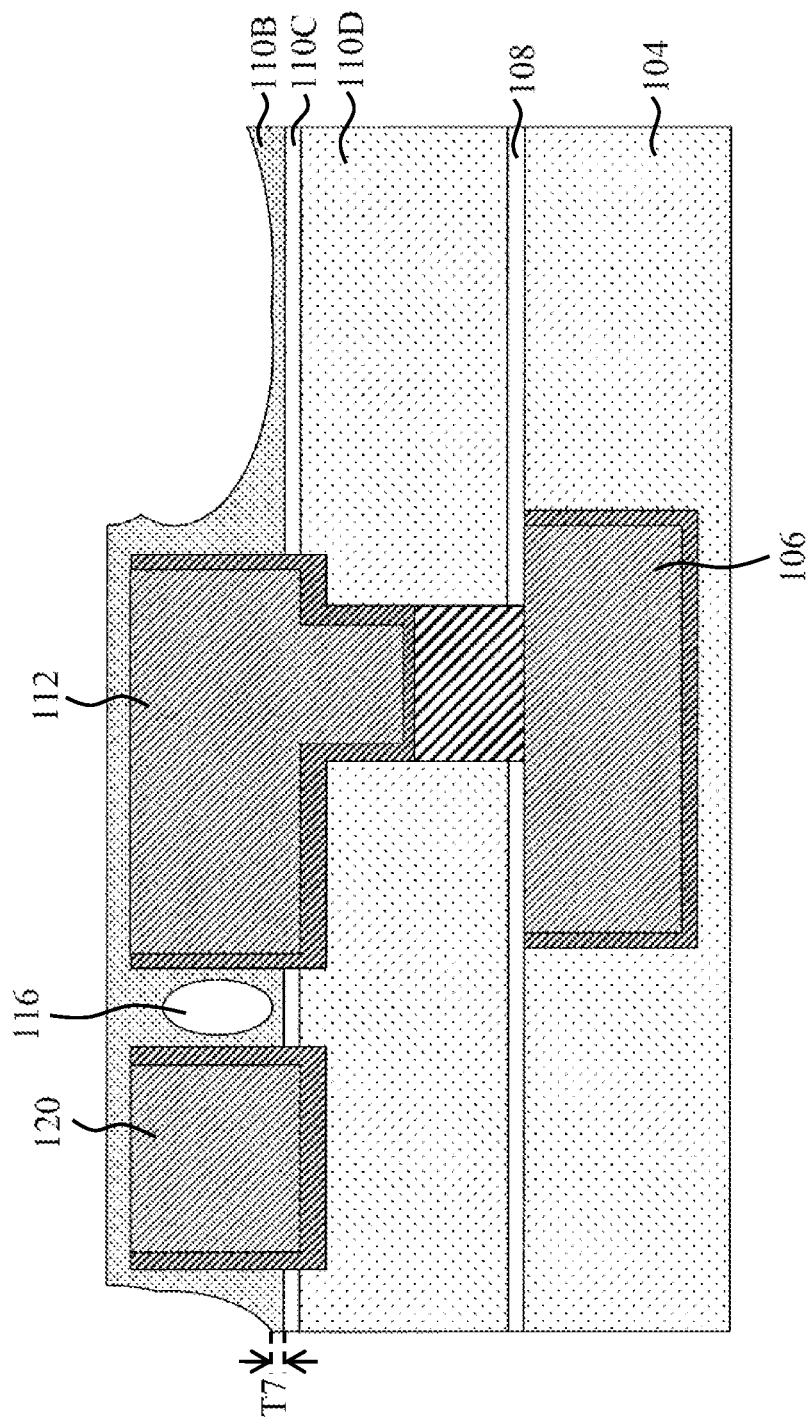
Figure 16:
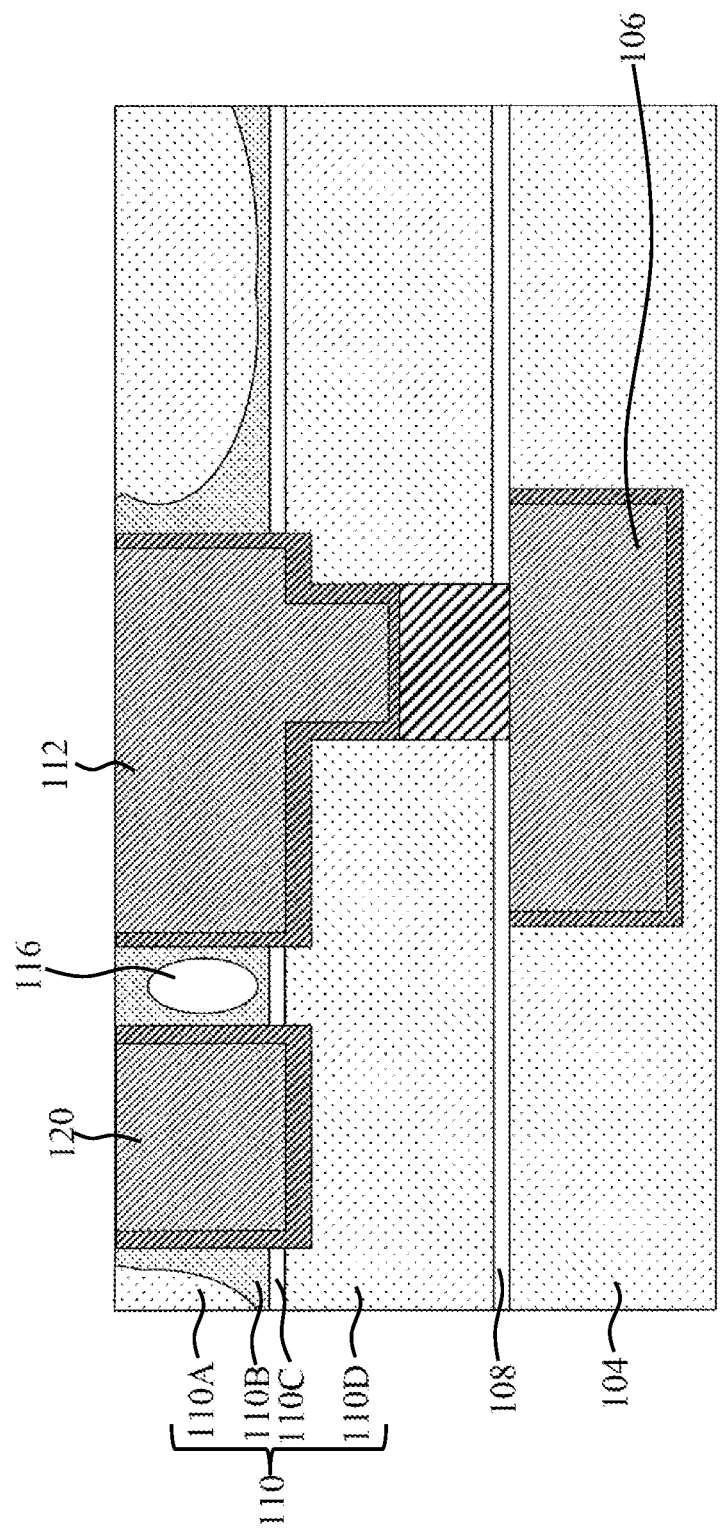

FIGS. 14 through 16 illustrate various intermediary steps of forming a multilayer dielectric according to some embodiments. In FIG. 14, sacrificial layer 202 is removed using an etching process, for example. The etching process may include using a chemical etchant that selectively etches sacrificial layer 202 at a higher rate than etch stop layer 110C or conductive line 120/conductive feature 112. Thus, etch stop layer 110C may be used to prevent the further etching of underlying dielectric layers (e.g., layer 110D) during the removal of sacrificial layer 202. The removal of sacrificial layer 202 exposes upper sidewalls of conductive line 120 and conductive feature 112.

In FIG. 15, reinforcement layer 110B is deposited over etch stop layer 110D, and reinforcement layer 110B may extend along sidewalls of conductive feature 112/conductive line 120. Reinforcement layer 110B may comprise a dielectric material having better structural integrity than dielectric layer 110D. For example, reinforcement layer 110B comprises USG in an embodiment. The deposition process of reinforcement layer 110B may form voids 116 in areas where the aspect ratio between neighboring features (e.g., conductive feature 112 and conductive line 120) is high (e.g., greater than 1). For example, the deposition of reinforcement layer 110B may comprise a poor step coverage conformal process, such as CVD or the like. More particularly, the material of reinforcement layer 110B may build up on the upper portions an opening between conductive feature 112/conductive line 120 faster than along the sidewalls and bottom of the opening as a result of the opening's relatively high aspect ratio. This process leads to the formation of an overhang at the edge of the upper portion of the opening, and as the deposition process continues, the overhangs will merge, sealing off the opening and forming void 116. Void 116 lowers the k-value of the reinforcement layer 110B, advantageously lowering parasitic capacitance amongst conductive features. In areas where the aspect ratio is lower, voids may not be formed, and reinforcement layer 110B may be formed to a thickness T7 on an upper surface of etch stop layer 110C. In some embodiments, thickness T7 may depend on distance between adjacent conductive features in order to facilitate the formation of voids 116. For example, when the spacing between conductive line 120 and conductive feature 112 is about 20 Å, thickness T7 may be about 10 Å (e.g., half the width of the spacing). As further illustrated by FIG. 15, reinforcement layer 110B may be deposited to cover top surfaces of conductive feature 112/conductive line 120 although in other embodiments, the top surfaces may only be partially covered to uncovered.

Subsequently, in FIG. 16, ELK layer 110A is deposited over a top surface of reinforcement layer 110B using any suitable method (e.g., CVD). In some embodiments, ELK layer 110A is used to lower the k-value of the dielectric material surrounding various conductive features, advantageously lowering parasitic capacitance. After ELK layer 110A is deposited, a planarization process (e.g., CMP, etch back, or the like) may be used to expose conductive feature 112 and conductive line 120. Thus, multilayered dielectric layer 110 may be formed around conductive feature 112 and conductive line 120. Dielectric layer 110 includes a reinforcement layer 110B extending along sidewalls of conductive features to improve the structural integrity of device 200. ELK layer 110A and voids 116 may also be formed to lower the k-value of multilayer dielectric 110.

Figure 17:
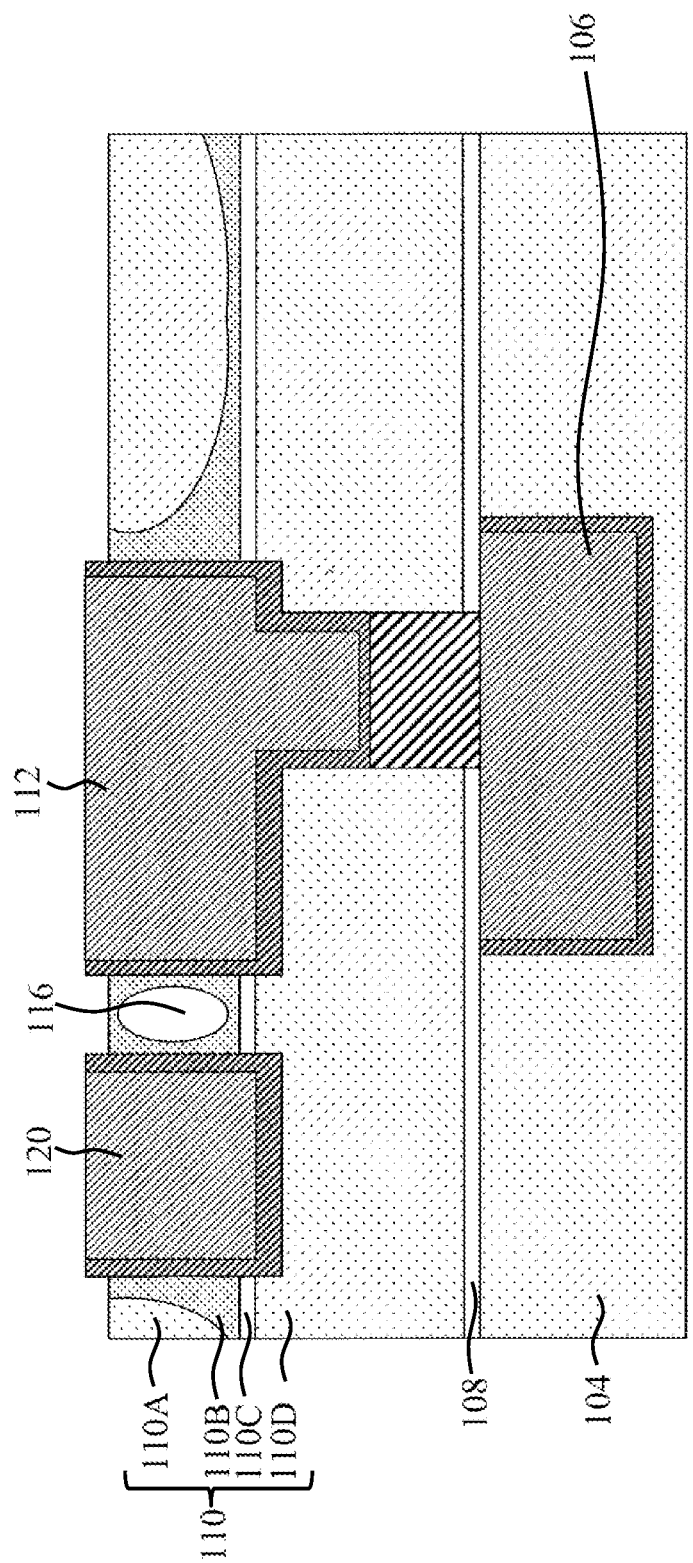
Figure 18:
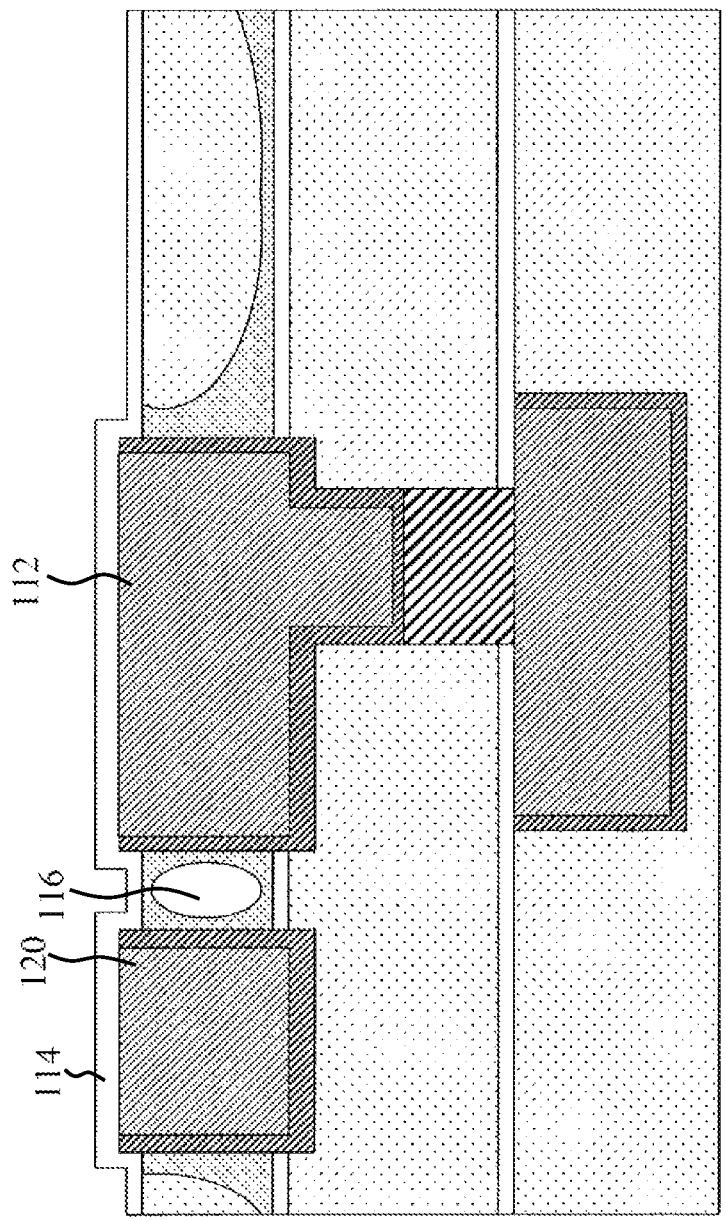

FIGS. 17 and 18 illustrate the formation of a non-planar protective layer 114 over conductive feature 112 and conductive line 120. First, in FIG. 17, reinforcement layer 110B and ELK layer 110A are etched back so that top surfaces of reinforcement layer 110B and ELK layer 110A are lower than top surfaces of conductive feature 112 and conductive line 120. Next, in FIG. 18, protective layer 114 is deposited over reinforcement layer 110B, ELK layer 110A, conductive feature 112, and conductive line 120 using any suitable process (e.g., CVD, PECVD, and the like). In some embodiments, protective layer 114 extends along at least upper sidewalls of conductive feature 112 and conductive line 120. As described above, by using a non-planar protective layer, ion diffusion distance for the conductive material of conductive feature 112/conductive line 120 within protective layer 114 is increased, improving device performance (e.g., improving TDDB performance).

Figure 19:
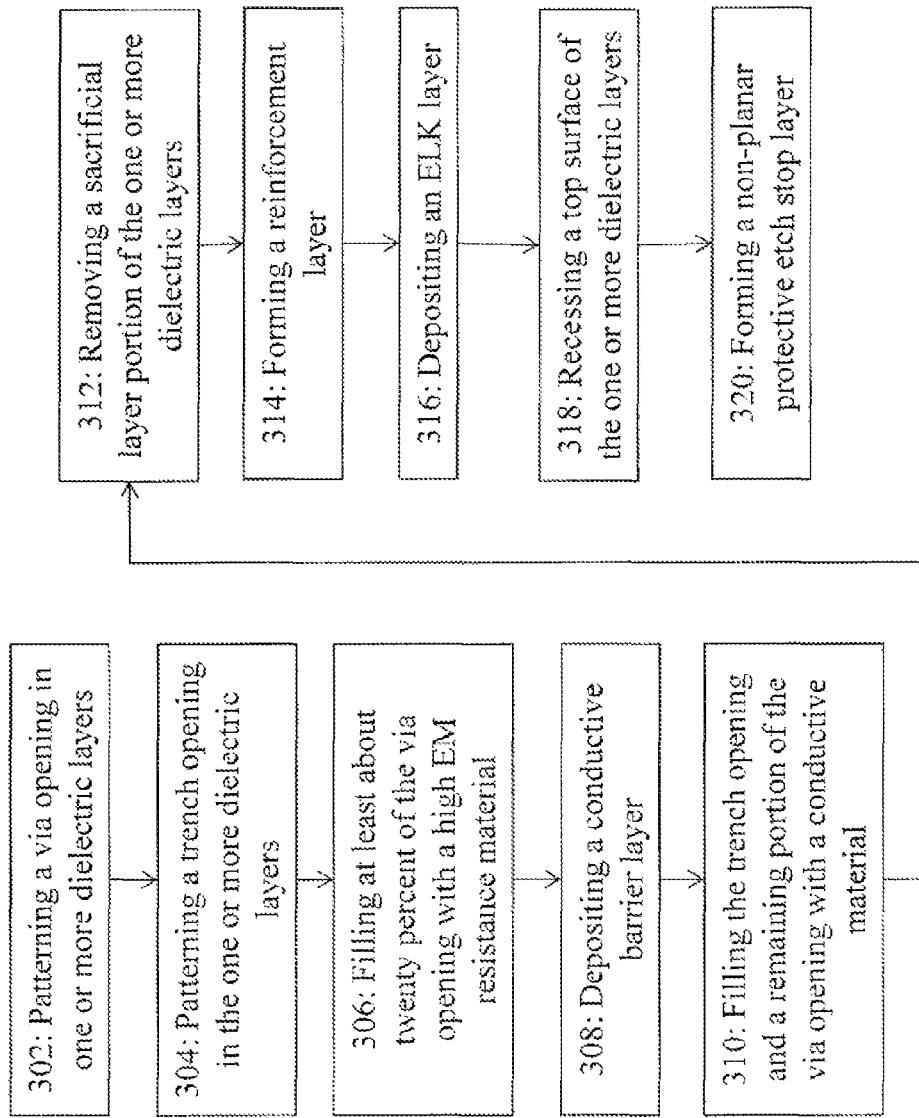
FIG. 19 illustrates a process flow for forming a semiconductor device in accordance with some embodiments.

FIG. 19 illustrates an example process flow 300 for making a semiconductor device according to various embodiments. In step 302, a via opening (e.g., opening 210) is formed in one or more dielectric layers (e.g., dielectric layer 110 and/or multilayer dielectric 110A through 110D). The via opening exposes an underlying conductive feature (e.g., conductive feature 106). In step 304, a trench opening (e.g., opening 218) is formed in the one or more dielectric layers and connected to the via opening.

In steps 306 through 310, a dual damascene conductive feature (e.g., conductive feature 112) is formed. In step 306, at least about 20% of the via opening is filled with a high EM resistance material (e.g., the material of bottom portion 112B) using, for example, electroless plating. In step 308, a conductive barrier layer (e.g., conductive barrier layer 112C) is deposited on sidewalls of the trench/via opening and on the high EM resistance material. In step 310, the trench opening and a remainder of the via opening is filled with a different conductive material (e.g., copper) than the high EM resistance material.

In some embodiments, the process flow may continue with step 312 where a sacrificial layer portion (e.g., sacrificial layer 202) of the one or more dielectric layers is removed. In step 314, a reinforcement layer (e.g., reinforcement layer 110B) may be deposited along sidewalls of the dual damascene conductive feature. The deposition of the reinforcement layer may include forming voids (e.g., voids 116) in the reinforcement layer in areas where spacing between adjacent features has a high aspect ratio. In step 316, an ELK layer (e.g., ELK layer 110A) is deposited over the reinforcement layer. In some embodiments, the process flow may continue further with step 314 where a top surface of the one or more dielectric layers is recessed. In step 316, a non-planar protective etch stop layer (e.g., etch stop layer 114) is formed over the one or more dielectric layers and the dual damascene conductive feature. The non-planar protective etch stop layer may further extend along sidewalls of the dual damascene conductive feature.

Thus, as described above an embodiment interconnect layer includes at least a conductive feature having a dual damascene structure. A bottom of a via portion of the conductive feature may be formed of a high EM resistance material (e.g., Co, Ta, TaN, and the like). In some embodiments, the bottom via portion makes up at least about 20% of a total thickness of the via portion of the conductive feature. It has been observed by configuring the bottom of the via portion as described above, improved EM characteristics and device performance can be achieved, for example, by reducing the formation of voids in the conductive feature. Additionally, a reinforcement layer may be disposed sidewalls of a line portion of the conductive feature. The reinforcement layer may improve the structural integrity of the interconnect layer, and voids and/or an ELK layer may be formed in and/or deposited over the reinforcement layer to lower the interconnect layer's dielectric constant. Furthermore, a protective etch stop layer may be deposited over the conductive feature. The protective etch stop layer may be non-planar and extend along upper sidewalls of the conductive feature to increase ion diffusion distance within the etch stop layer, improving device performance.

In accordance with an embodiment, a semiconductor device includes a first conductive feature in a dielectric layer and a second conductive feature over the dielectric layer and electrically connected to the first conductive feature. The second conductive feature includes a dual damascene structure and further includes a top portion within both a line portion and a via portion of the second conductive feature and a bottom portion in the via portion of the second conductive feature. The bottom portion comprises a different conductive material than the top portion, and a thickness of the bottom portion is at least about twenty percent of a total thickness of the via portion of the second conductive feature.

In accordance with another embodiment, a device includes a first low-k dielectric layer comprising a first conductive feature, a second low-k dielectric layer over the first low-k dielectric layer, a reinforcement layer over the second low-k dielectric layer, and a third low-k dielectric layer over the reinforcement layer. The third low-k dielectric layer has a lower dielectric constant than the reinforcement layer. The device further includes a second conductive feature extending through the second low-k dielectric layer, the reinforcement layer, and the third low-k dielectric layer. A portion of the reinforcement layer is disposed between the third low-k dielectric layer and the second conductive feature. The second conductive feature comprises a conductive line, a top conductive via portion smoothly connected to the conductive line, a conductive barrier layer on sidewalls of the conductive line and the top conductive via portion, and a bottom conductive via portion comprising a different material than the top conductive via portion. The conductive barrier layer is disposed between the top conductive via and the bottom conductive via.

In accordance with yet another embodiment, a method for forming a semiconductor device includes patterning a via opening in one or more dielectric layers and patterning a trench opening connected to the via opening in the one or more dielectric layers. The via opening exposes a first conductive feature under the one or more dielectric layers. The method further includes forming a second conductive feature in the one or more dielectric layers and electrically connected to the first conductive feature. Forming the second conductive feature includes electroless plating at least about twenty percent of the via opening with a first conductive material, depositing a conductive barrier layer over the first conductive material, and filling the trench opening and a remaining portion of the via opening with a second conductive material different from the first conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first conductive feature in a dielectric layer;

a second conductive feature over the dielectric layer and electrically connected to the first conductive feature, wherein the second conductive feature comprises a dual damascene structure having a line portion and a via portion, and wherein the second conductive portion further comprises:
  a top portion within both the line portion and the via portion; and
  a bottom portion in the via portion, wherein the bottom portion comprises a different conductive material than the top portion, and wherein a thickness of the bottom portion above the dielectric layer is about twenty percent to about forty percent of a total thickness of the via portion of the second conductive feature.

2. The semiconductor device of claim 1, wherein the second conductive feature further comprises a conductive barrier layer disposed along sidewalls of the top portion, wherein the conductive barrier layer is further disposed between the top portion and the bottom portion along a line perpendicular to a top surface of the first conductive feature.

3. The semiconductor device of claim 1, wherein the top portion comprises copper, and wherein the bottom portion comprises cobalt, tantalum, tantalum nitride, or a combination thereof.

4. The semiconductor device of claim 1, wherein the bottom portion is partially disposed within the first conductive feature.

5. The semiconductor device of claim 1, further comprising a reinforcement layer disposed at least partially on sidewalls of the line portion of the second conductive feature.

6. The semiconductor device of claim 5, wherein the reinforcement layer comprises undoped silicate glass.

7. The semiconductor device of claim 5, wherein the reinforcement layer further comprises a void.

8. The semiconductor device of claim 5 further comprising an extra low-k (ELK) dielectric layer over the reinforcement layer, wherein the ELK dielectric layer comprises a lower dielectric constant than the reinforcement layer, and wherein the reinforcement layer is disposed between the ELK dielectric layer and the second conductive feature.

9. The semiconductor device of claim 1, further comprising a protective etch stop layer on a top surface and extending along upper sidewalls of the second conductive feature.

10. A device comprising:
  a first low-k dielectric layer comprising a first conductive feature;
  a second low-k dielectric layer over the first low-k dielectric layer;
  a reinforcement layer over the second low-k dielectric layer;
  a third low-k dielectric layer over the reinforcement layer, wherein the third low-k dielectric layer has a lower dielectric constant than the reinforcement layer; and
  a second conductive feature extending through the second low-k dielectric layer, the reinforcement layer, and the third low-k dielectric layer, wherein a portion of the reinforcement layer is disposed between the third low-k dielectric layer and the second conductive feature, and wherein the second conductive feature comprises:
    a conductive line;
    a top conductive via portion smoothly connected to the conductive line;
    a conductive barrier layer on sidewalls of the conductive line and the top conductive via portion; and
    a bottom conductive via portion comprising a different material than the top conductive via portion, wherein the conductive barrier layer is disposed between the top conductive via portion and the bottom conductive via portion.

11. The device of claim 10, wherein the conductive line and the top conductive via portion comprises copper, and wherein the bottom conductive via portion comprises cobalt, tantalum, tantalum nitride, or a combination thereof.

12. The device of claim 10, wherein a thickness of the bottom conductive via portion is about twenty percent to about forty percent of a total thickness of the top conductive via portion, the conductive barrier layer, and the bottom conductive via portion.

13. The device of claim 10, further comprising a third conductive feature adjacent the second conductive feature, wherein the reinforcement layer comprises a void disposed between the second and the third conductive features.

14. The device of claim 10, further comprising a protective etch stop layer on a top surface and extending along upper sidewalls of the second conductive feature.

15. A method for forming a semiconductor device, the method comprising:
  patterning a via opening in one or more dielectric layers, wherein the via opening exposes a first conductive feature under the one or more dielectric layers;
  patterning a trench opening in the one or more dielectric layers, wherein the trench opening is connected to the via opening; and
  forming a second conductive feature in the one or more dielectric layers and electrically connected the first conductive feature, wherein forming the second conductive feature comprises:
    electroless plating at least about twenty percent of the via opening with a first conductive material;
    depositing a conductive barrier layer in the via opening and over the first conductive material; and
    filling the trench opening and a remaining portion of the via opening with a second conductive material different from the first conductive material, wherein the conductive barrier layer is disposed between the first conductive material and the second conductive material along a line perpendicular to a top surface of the first conductive material.

16. The method of claim 15, wherein the first conductive material comprises cobalt, tantalum, tantalum nitride, or a combination thereof, and wherein second conductive material comprises copper.

17. The method of claim 15, wherein the one or more dielectric layers comprises a sacrificial layer over a first low-k dielectric layer, wherein the method further comprises:
  removing the sacrificial layer to expose upper sidewalls of the second conductive feature;
  depositing a reinforcement layer over the first low-k dielectric layer, wherein the reinforcement layer extends along sidewalls of the second conductive feature; and
  depositing a second low-k dielectric layer over the reinforcement layer, wherein the second low-k dielectric layer comprises a lower dielectric constant than the reinforcement layer.

18. The method of claim 17, wherein the one or more dielectric layers further comprises a third conductive feature adjacent the second conductive feature, and wherein depositing the reinforcement layer comprises forming a void in the reinforcement layer between the second conductive feature and the third conductive feature.

19. The method of claim 15, further comprising:
  recessing a top surface of the one or more dielectric layers to be lower than a top surface of the second conductive material; and
  depositing a protective etch stop layer on top surfaces of the one or more dielectric layers and the second conductive material, wherein the protective etch stop layer extends along upper sidewalls of the second conductive feature.

20. The method of claim 15, wherein the patterning of the via opening comprises etching the first conductive feature, wherein after forming the first conductive material, the first conductive feature extends along a sidewall and a bottom surface of the first conductive material.

\* \* \* \* \*